United States Patent
Takehiko et al.

(10) Patent No.: US 8,330,167 B2
(45) Date of Patent: *Dec. 11, 2012

(54) GAN-BASED FIELD EFFECT TRANSISTOR AND METHOD OF MANUFACTURING THE SAME

(75) Inventors: Nomura Takehiko, Tokyo (JP); Sato Yoshihiro, Tokyo (JP); Kambayashi Hiroshi, Tokyo (JP); Kaya Shusuke, Tokyo (JP); Iwami Masayuki, Tokyo (JP); Kato Sadahiro, Tokyo (JP)

(73) Assignee: Furukawa Electric Co., Ltd, Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 12/625,579

(22) Filed: Nov. 25, 2009

(65) Prior Publication Data

US 2010/0127275 A1    May 27, 2010

(30) Foreign Application Priority Data

Nov. 26, 2008  (JP) .................................. 2008-300637

(51) Int. Cl.
*H01L 21/00* (2006.01)

(52) U.S. Cl. ........... 257/76; 257/E29.089; 257/E29.246; 257/E29.271; 257/E21.403; 257/E21.409

(58) Field of Classification Search ............ 257/43, 257/189–197, 205, E21.403, 29.81, 91, 127, 257/246, 252
See application file for complete search history.

(56) References Cited

U.S. PATENT DOCUMENTS

| | | | | |
|---|---|---|---|---|
| 5,250,822 A * | 10/1993 | Sonoda et al. | ................ | 257/194 |
| 6,274,893 B1 * | 8/2001 | Igarashi et al. | ............... | 257/192 |
| 6,521,961 B1 * | 2/2003 | Costa et al. | .................. | 257/402 |
| 7,557,389 B2 * | 7/2009 | Amasuga et al. | ............. | 257/194 |
| 7,642,567 B2 * | 1/2010 | Amasuga et al. | ............. | 257/194 |
| 7,812,371 B2 * | 10/2010 | Kaya et al. | ..................... | 257/192 |
| 7,851,884 B2 * | 12/2010 | Asai et al. | ..................... | 257/523 |
| 7,859,021 B2 * | 12/2010 | Kaneko | .......................... | 257/194 |
| 7,956,383 B2 * | 6/2011 | Kuroda et al. | ................ | 257/192 |
| 8,035,128 B2 * | 10/2011 | Ikeda et al. | .................... | 257/192 |
| 8,039,329 B2 * | 10/2011 | Nakazawa et al. | ............ | 438/172 |
| 2010/0148184 A1 * | 6/2010 | Takehiko et al. | ................ | 257/76 |
| 2010/0155720 A1 * | 6/2010 | Kaneko | .......................... | 257/43 |
| 2011/0215379 A1 * | 9/2011 | Ikoshi et al. | ................... | 257/194 |
| 2011/0215424 A1 * | 9/2011 | Sato | ............................. | 257/409 |
| 2011/0254055 A1 * | 10/2011 | Sato et al. | ..................... | 257/194 |

FOREIGN PATENT DOCUMENTS

WO         03071607 A1    8/2003

* cited by examiner

*Primary Examiner* — Michael Lebentritt
(74) *Attorney, Agent, or Firm* — Turocy & Watson, LLP

(57) ABSTRACT

A GaN-based field effect transistor 101 comprises: a substrate 101; a channel layer 104 comprised of p-type GaN-based semiconductor material formed on the substrate 101; an electron supplying layer 106 formed on said channel layer 104 and comprised of GaN-based semiconductor material which has band gap energy greater than that of said channel layer 104; a gate insulating film 111 formed on a surface of said channel layer which was exposed after a part of said electron supplying layer was removed; a gate electrode 112 formed on said gate insulating film; a source electrode 109 and a drain electrode 110 formed so that said gate electrode 112 positions in between them; and a second insulating film 113 formed on said electron supplying layer, which is a different insulating film from said gate insulating film 111 and has electron collapse decreasing effect.

7 Claims, 8 Drawing Sheets

GAN-BASED FIELD EFFECT TRANSISTOR AND METHOD OF MANUFACTURING THE SAME

CROSS-REFERENCE TO RELATED APPLICATION

This application claims priority to Japanese patent application serial No. 2008-300637, filed on Nov. 26, 2008, the entire content of which is incorporated herein by the reference.

BACKGROUND OF THE INVENTION

1. Field of the Invention

The present invention relates to GaN-based field effect transistor comprising nitride-based compound semiconductor for use in devices for power electronics and devices for high frequency amplification, and manufacturing process thereof.

2. Description of the Related Art

Since wide band gap semiconductors represented by III-V group nitride-based compound semiconductors exhibit high breakdown field, good electron transferring characteristics, and good thermal conductivity, they are very attractive as semiconductor devices for high temperature, high power, or high frequency. For instance, in a field effect transistor (FET) with AlGaN/GaN hetero-structure, two-dimensional electron gas is generated at the boundary due to the spontaneous polarization and the Piezo effect. Since this two-dimensional electron gas has high electron mobility and carrier density, the hetero junction FET (HFET) employing AlGaN/GaN hetero junction structure has low on-resistance and fast switching speed. These characteristics are very suitable for power switching applications.

Typical AlGaN/GaN HFETs are normally-on type devices in which electric current flows through when there are no bias applied to the gate and in which electric current is blocked by applying negative electric voltage at the gate. In contrast, in applications in power switching, due to securing safety in case the device breaks down, normally-off type devices are preferable in which electric current does not run through when bias is not applied to the gate and in which electric current flows through when positive electric voltage is applied to the gate.

Patent Document 1 shows a metal-oxide semiconductor field effect transistor (MOSFET) of MOS structure wherein an electron supply layer comprising AlGaN, etc., is etched off at the gate portion and an insulating layer is formed on the etching surface of the drift layer. As regards this structure, space between the gate and the drain is formed of a hetero junction structure comprising AlGaN/GaN, and since the two-dimensional electron gas that is generated at the hetero junction boundary has high electron mobility, it can avoid increase in on-resistance in respect of the sheet carrier concentration that is needed for maintaining high resisting voltage. That is, it is a structure suitable for achieving high breakdown voltage with low resistance.

[Patent Document 1] WO 03/071607 Publication

However, since the AlGaN/GaN hetero junction structure is influenced by a phenomenon called, "current collapse" in which amount of current changes with the passage of time, there will be adverse effects upon features of the device such as an increase in on-resistance following application of high voltage between the gate and the drain, an increase in on-resistance at the time of forward flow of current, etc.

As regards the cause of the current collapse, the carrier traps between HFET AlGaN layer and the protection film and the carrier traps within HFET channel layer (drift layer) are believed to influence it.

SUMMARY OF THE INVENTION

It is an object of the present invention to at least partially solve the problems in the conventional technology.

A GaN-based field effect transistor according to an aspect of the invention comprises: a substrate; a channel layer comprised of p-type GaN-based semiconductor material formed on the substrate; an electron supplying layer formed on said channel layer and comprised of GaN-based semiconductor material which has band gap energy greater than that of said channel layer; a first insulating film formed on a surface of said channel layer which was exposed after a part of said electron supplying layer was removed; a gate electrode formed on said first insulating film; a source electrode and a drain electrode formed so that said gate electrode positions in between them; and a second insulating film formed on said electron supplying layer, which is a different insulating film from said first insulating film and has electron collapse decreasing effect.

In accordance with this structure, while operating as normally-off type device, low on-resistance and high speed switching operation can be achieved due to two-dimensional gas formed at the boundary between the electron supply layer of the channel layer. Since the second insulating film that has electron collapse decreasing effect is formed on said electron supply layer, decrease in trap densities and reduction in current collapse are accomplished.

A process for manufacturing a GaN-based field effect transistor according to another aspect of the invention comprises: forming on a substrate, in sequence, a channel layer comprised of p-type GaN-based semiconductor material, and an electron supplying layer comprised of GaN-based semiconductor material having band gap energy greater than that of said channel layer; forming a first insulating film on a surface of said channel layer which was exposed after a part of said electron supplying layer was removed; forming a gate electrode on said first insulating film; forming a source electrode and a drain electrode so that said gate electrode positions in between them; and forming on said electron supplying layer a second insulating film, which is a different insulating film with said first insulating film and has electron collapse decreasing effect; and wherein said second film is made with either of p-CVD, Cat-CVD (catalytic CVD), or ECR (electron cyclotron resonance) sputtering.

The above and other objects, features, advantages and technical and industrial significance of the present invention will be better understood by reading the following detailed description of presently preferred embodiments of the invention, when considered in connection with the accompanying drawings.

DETAILED DESCRIPTION OF THE PREFERRED EMBODIMENTS

Figure 1:
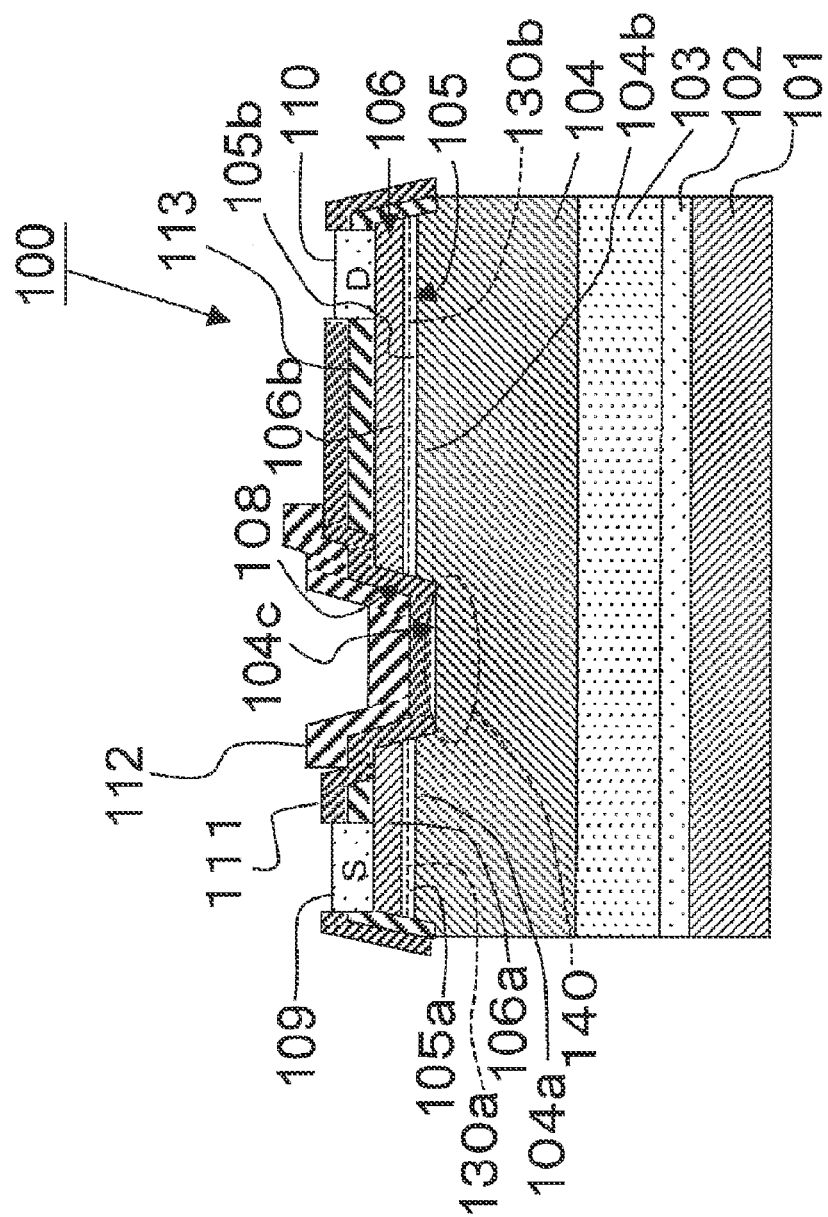
FIG. 1 is a schematical cross-sectional diagram of MOSFET according to an embodiment.

Embodiments embodying the invention are described referring to the drawings. Upon describing each embodiment, duplication has been avoided by adding a similar symbol for a similar part.

First Embodiment

FIG. 1 is a schematical cross-sectional diagram of GaN-based field effect transistor (hereinafter called, "MOSFET") according to an embodiment of the invention. In the MOSFET 100, on a substrate 101 comprising sapphire, SiC, Si, etc., an AlN layer 102, a buffer layer 103 that has been formed by alternate lamination of GaN layer and AlN layer, and a channel layer 104 comprising p-GaN or undoped GaN are formed. Further, a drift layer 105 comprising undoped GaN, and an electron supply layer 106 comprising AlGaN whose band gap energy is greater than that of the drift layer 105, are sequentially laminated on the channel layer 104. Moreover, a portion of the drift layer 105 and the electron supply layer 106 has been removed down to the depth of the channel layer 104 thereby forming a recess section 108. In addition, a source electrode 109 and a drain electrode 110 are formed on the electron supply layer 106 on both sides of the recess section 108. Furthermore, a second insulating film 113 comprising SiN, possessing current collapse decreasing effect is formed on the electron supply layer 106. A gate insulation film 111 (first insulating film) comprising $SiO_2$ is formed to extend inside the recess section 108 and the surface 104c of the channel layer 104, and a gate electrode 112 is formed on the gate insulating film 111.

Thus, a second insulating film 113 possessing current collapse decreasing effect, which is another insulating film from the gate insulating film 111 that acts as the first insulation film, is formed on the electron supply layer 106. Moreover, while the surface 104c of the channel layer 104 that is inside the recess section 108 is located in the vicinity of the upper surface of the channel layer 104 in the drawing, the depth of that surface 104c from the surface of the channel layer 104 can be set suitably.

Thus, the electron supply layer 106 in MOSFET 100 has the first electron supply layer 106a and the second electron supply layer 106b that are mutually segregated on both sides of the gate portion of MOS structure composed of the channel layer 104, the gate insulating film 111 and the gate electrode 112, directly under the gate insulating film 111. Besides, the channel 104 has the left and right channel layers 104a, 104b mutually segregated on both sides of the gate portion of MOS structure. The left side drift layer 105a comprising p-type or undoped GaN semiconductor material is formed in between the left side channel layer 104a and the first electron supply layer 106a, and the right side drift layer 105b comprising p-type or undoped GaN semiconductor material is formed in between the right channel layer 104b and the second electron supply layer 106b. As regards the MOSFET 100, since the first electron supply layer 106a and the second electron supply layer 106b respectively form hetero junction on the surface of left and right drift layers 105a and 105b, two-dimensional electron gas layers 130a and 130b are formed at the boundary of the joining part. Consequently, the two-dimensional electron gas acts as the carrier, and the left and right drift layers 105a, 105b exhibit electrical conductivity. In other words, negative charge (electrons) accumulates at the drift layers 105a, 105b due to spontaneous polarization and piezoelectricity (Piezo effect) at the AlGaN/GaN hetero junction boundary. Even if the AlGaN layer is undoped, due to the accumulation of electrons, the two-dimensional electron gas layers 130a, 130b of high concentration is formed directly under the hetero junction boundary in the left and right drift layers 105a, 105b, and it causes lowering of the channel resistance, which is the on-resistance of the MOSFET 100.

Moreover, as regards the MOSFET 100, since no hetero junction is formed in the area directly under the gate electrode 112 of the channel layer 104, two-dimensional electron gas layers is not formed either (there is a break). When specified voltage (above threshold) is applied at the gate electrode 112 in forward direction, an inversion layer 140 is formed in the channel layer 104 that is directly under the gate electrode 112. The inversion layer 140 coupled with the left and right two-dimensional electron gas layers 130a, 130b, produces a drain electric current.

As regards the depth forming the recess 108, it is good if two-dimensional electron gas layer is not formed in the area directly under the gate electrode 112, and it is good if the depth reaches the drift layer 105 through at least the electron supply layer 106. Thereby, the drift layer 105 does not get segregated into left and right. Thus, operation of a normally-off type field-effect transistor is accomplished.

In the MOSFET 100 according to an embodiment having the above structure, following functions and advantageous effects are accomplished:

While functioning as normally-off type, the MOSFET 100 is capable of achieving low on-resistance, high speed switching operations due to the two-dimensional electron gas generated respectively at the boundary of the electron supply layer 106 of the drift layer 105, i.e., the boundary of the drift layer 105a and the electron supply layer 106a as well as that of the drift layer 105b and the second electron supply layer 106b.

Moreover, in the MOSFET 100, since the second insulating film 113 comprising SiN having current-collapse decreasing effect is formed on the electron supply layer 106 (the first electron supply layer 106a and the second electron supply layer 106b), decreasing of the boundary level and reduction of the current collapse are accomplished.

In addition, since the gate insulating film 111 being gate oxide film makes use of $SiO_2$ having high breakdown voltage, it is able to avoid the lowering of the gate breakdown voltage resulting from countermeasures adopted against current collapse.

In the following, an example of a method for manufacturing the MOSFET 100 is described. FIGS. 2-8 are schematic diagrams illustrating a method for manufacturing the MOSFET 100. Furthermore, given below are descriptions of cases involving formation of semiconductor layers employing the metal-organic chemical vapor deposition (MOCVD) method.

Figure 2:
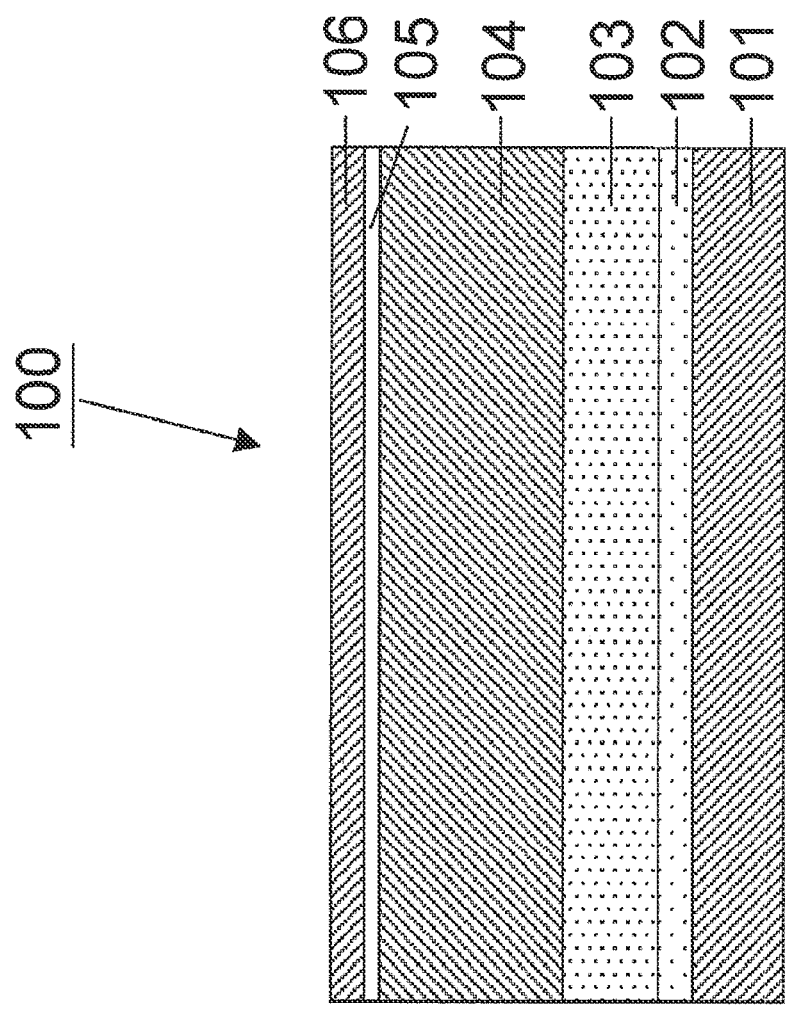
FIG. 2 is a diagram illustrating an example of the manufacturing process of MOSFET shown in FIG. 1.

To start with, as shown in FIG. 2, a substrate 101 comprising Si that takes (111) surface as the main surface is set to the MOCVD device, and hydrogen gas with 100% concentration is used as the carrier gas, trimethyl gallium (TMGa), trimethyl aluminium (TMAl) and $NH_3$ are introduced, and AlN layer 102, the buffer layer 103, and the channel layer comprising p-GaN are epitaxial grown sequentially on the substrate 101 at growth temperature 1050° C. Furthermore, Bis (cyclopentadienyl)magnesium (Cp$_2$Mg) is employed as p-type doping source against the channel layer 104, and the flow of Cp$_2$Mg is regulated in such a way that the level of concentration of Mg is about $1 \times 10^{17}$ cm$^{-3}$. Then, TMGa and NH$_3$ are introduced and the drift layer 105 comprising undoped GaN is epitaxial grown on the channel layer 104 at growth temperature 1050° C. Then, TMAl, TMGa and NH$_3$ are introduced, and the electron supply layer 106 comprising AlGaN whose 25% of the constituent is Al, is epitaxial grown.

Furthermore, as regards what is stated above, the buffer layer 103 consists of eight laminated layers of GaN/AlN compound layers having thickness 200 nm/20 nm, respectively. Moreover, the thickness of the AlN layer 102, the channel layer 104, the drift layer 105, and the electron supply layer 106 is 100 nm, 500 nm, 100 nm, and 20 nm, respectively.

Figure 3:
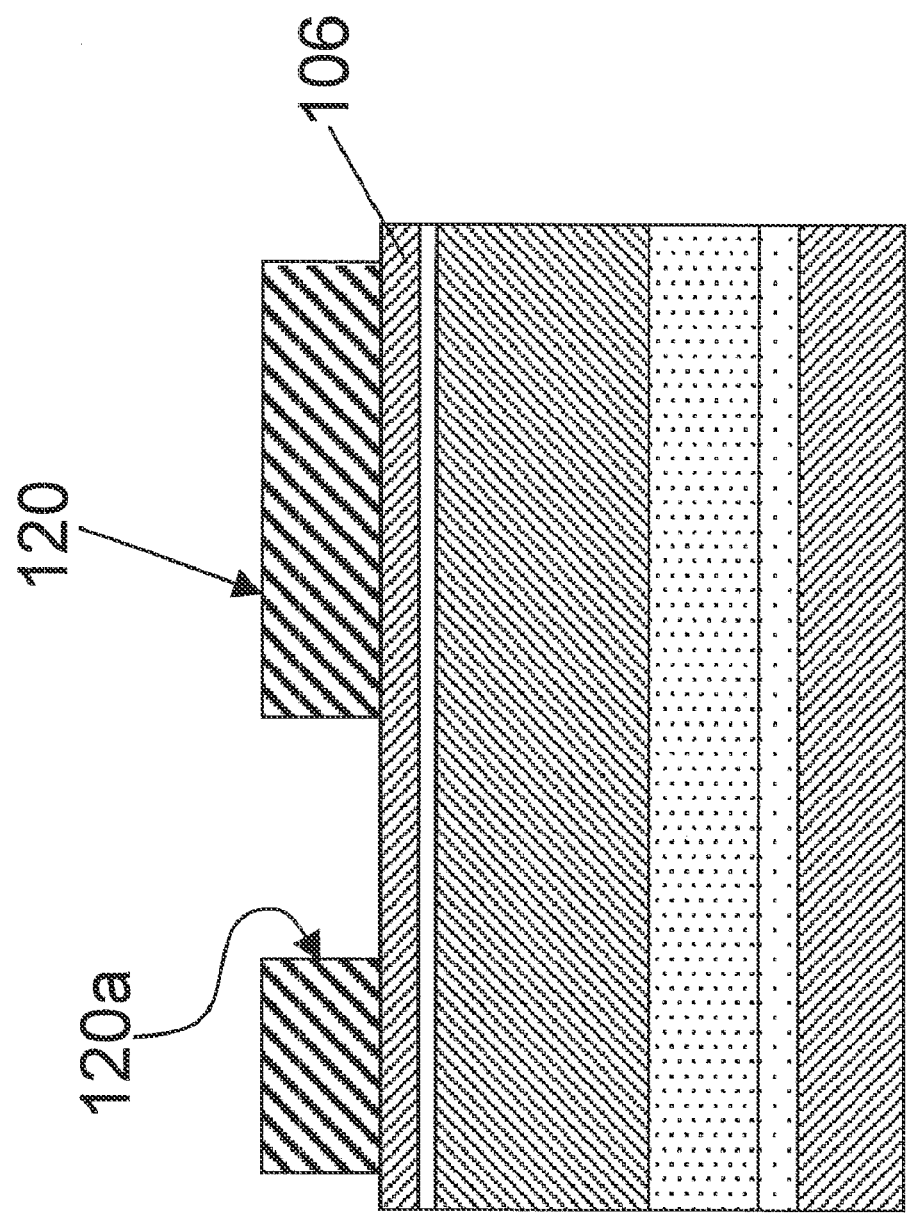
FIG. 3 is a diagram illustrating an example of the manufacturing process of MOSFET shown in FIG. 1.

In the following, as shown in FIG. 3, a mask layer 120 comprising SiO$_2$ having 500 nm thickness is formed on the electron supply layer 106, using the plasma chemical vapor deposition (PCVD) method, and then patterning is done employing photolithography and CF$_4$ gas, and the opening section 120a is formed.

Figure 4:
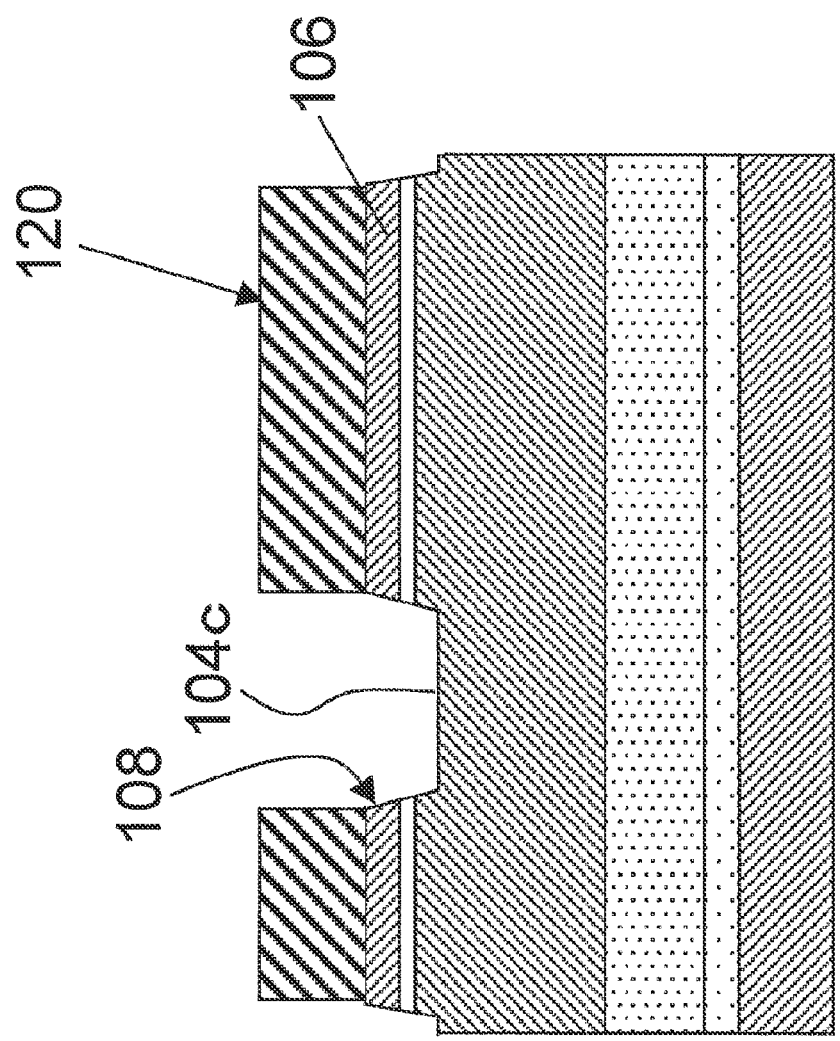
FIG. 4 is a diagram illustrating an example of the manufacturing process of MOSET shown in FIG. 1.

Then, as shown in FIG. 4, using the mask layer 120 as the mask, Cl$_2$ gas is employed as etching gas to remove a portion of the channel layer 104, the drift layer 105 and the electron supply layer 106 with etching, thus the recess section 108 is formed.

Furthermore, since etching is done beginning from the surface of the mask layer 120, in case the etching of the drift layer 105 and the electron supply layer 106 is carried through to expose the channel layer 104, the thickness of the mask layer 120 is made sufficient so that the electron supply layer 106 located outside the opening 120a will not be exposed.

Figure 5:
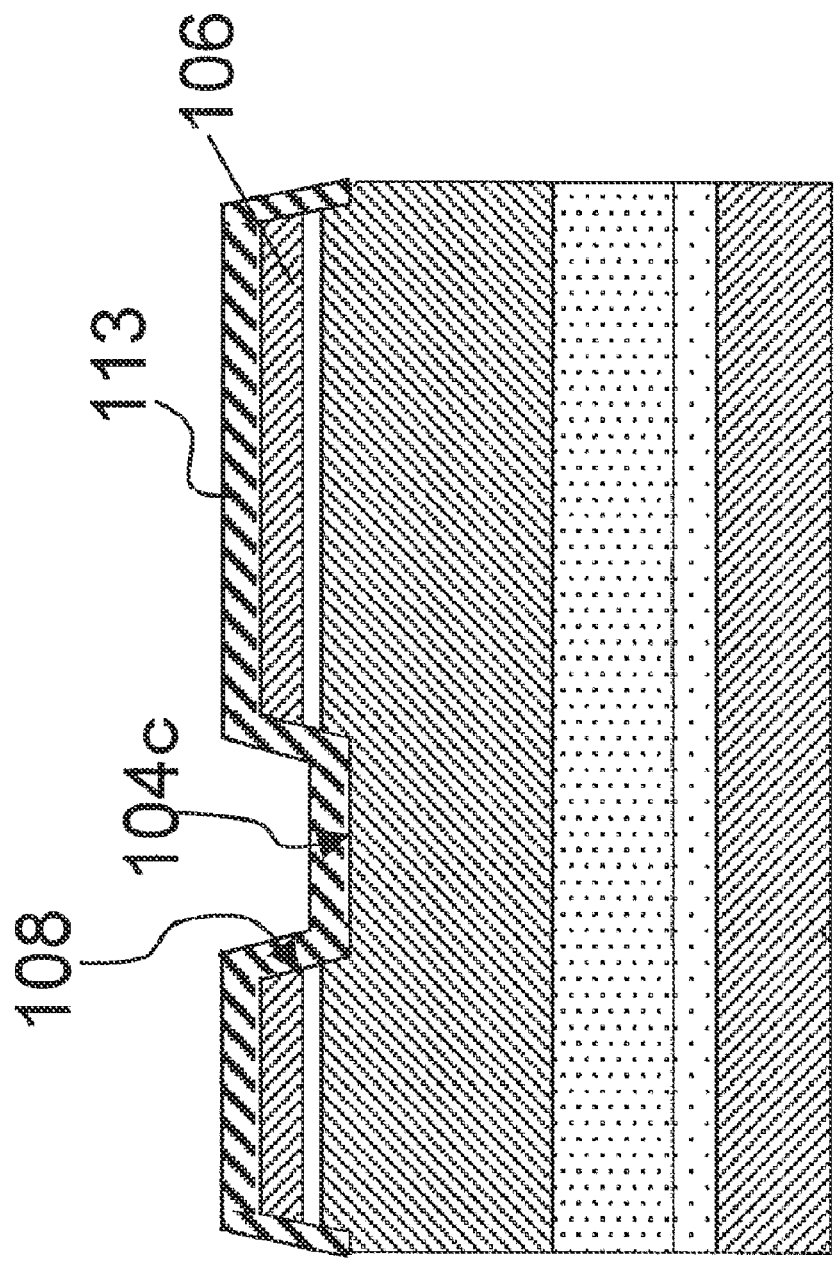
FIG. 5 is a diagram illustrating an example of the manufacturing process of MOSFET shown in FIG. 1.

In the following, as shown in FIG. 5, the mask layer 120 is removed, and the second insulating film 113 comprising SiN having thickness of 50 nm, that extends to the top of electron supply layer 106 as well as on the surface 104c of the channel layer 104 that is inside the recess section 108, is formed employing the PCVD method involving SiH$_4$ and N$_2$O as raw material gases.

Figure 6:
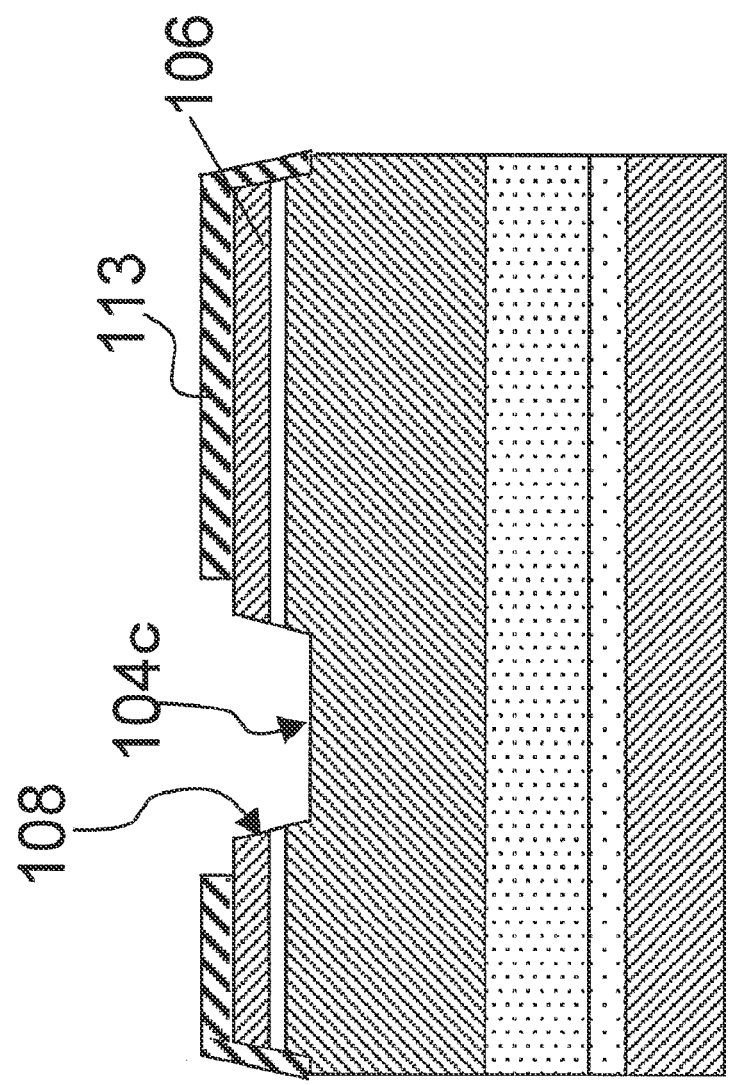
FIG. 6 is a diagram illustrating an example of the manufacturing process of MOSFET shown in FIG. 1.

Then, patterning is carried out using photolithography and a mask (not illustrated) with an opening on the recess section 108 is formed. As shown in FIG. 6, using this mask, the second insulating film 113 of the gate oxide film formed section is removed with fluoric acid.

Figure 7:
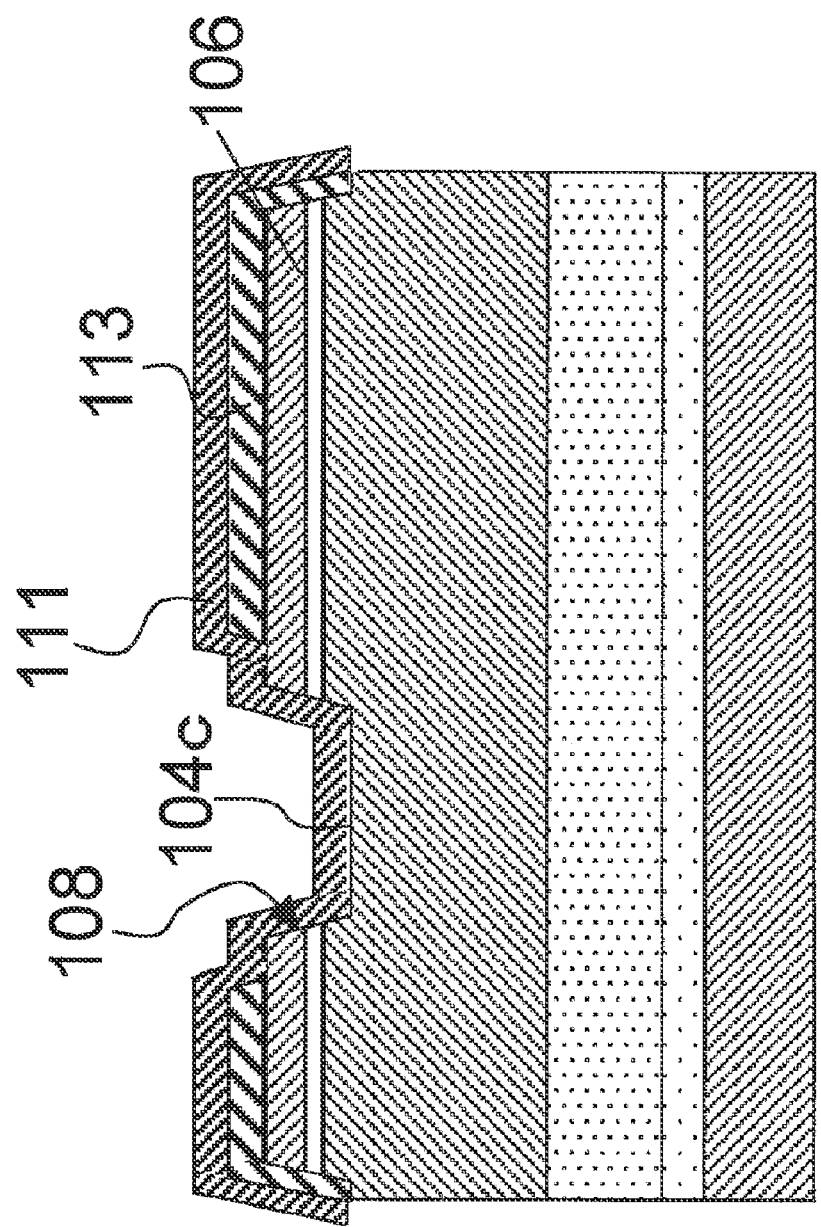
FIG. 7 is a diagram illustrating an example of the manufacturing process of MOSFET shown in FIG. 1.

Then, as shown in FIG. 7, using PCVD method that takes SiH$_4$ and N$_2$O as the raw materials, the first gate insulating film 111 comprising SiO$_2$ having a thickness of 60 nm is formed on the second insulating film 113, the recess section 108, and the surface 104c of the channel layer 103 that is inside the recess section 108.

Figure 8:
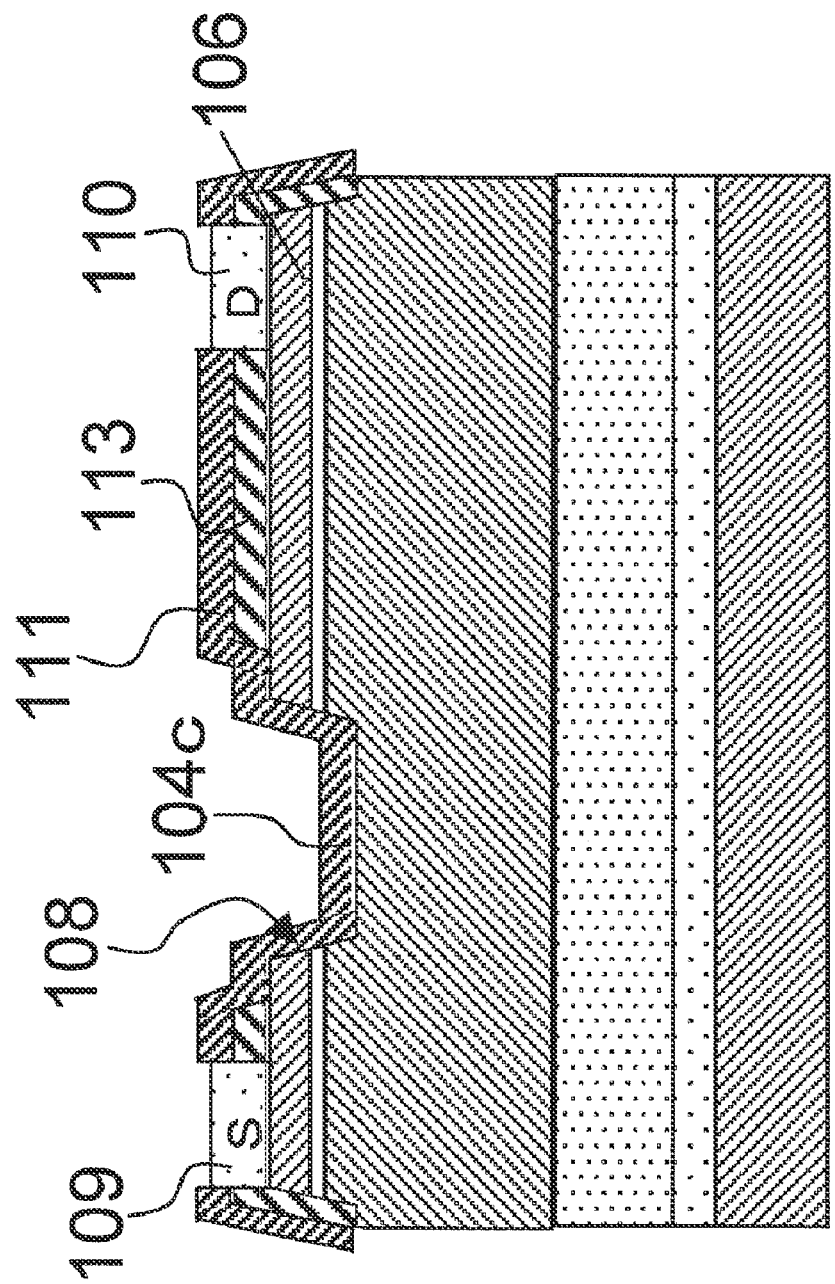
FIG. 8 is a diagram illustrating an example of the manufacturing process of MOSFET shown in FIG. 1.

Thereafter, as shown in FIG. 8, a portion of the gate insulating film 111 is removed with fluoric acid, and the source electrode 109 and the drain electrode 110 are formed on the electron supply layer 106, using a lift-off method. Moreover, the structure of both the source electrode 109 and the source electrode 110 is Ti/Al structure having 25 nm/300 nm thickness. As regards formation of a metal film, it can be achieved using sputtering method or vacuum vapor deposition method. Then, after having formed the source electrode 109 and the drain electrode 110, annealing is carried out for 10 minutes under 600° C.

Thereafter, the MOSFET 100 as shown in FIG. 1 is completed by forming the gate electrode 112 having Ti/Al structure on the gate insulating film 111 of the recess section 108, by using the lift-off method. The drain side end of the gate electrode 112 is formed in such a way as to superimpose it on the gate insulating film 111 and the insulating film 113, and by appropriately setting the length of the superimposed part and the total film thickness of the gate insulating film 111 and insulating film 113, it is enabled to bring in field plate effect that eases the electric field concentration between the gate/drain and to improve the resisting voltage.

As regards above example of MOSFET 100, the process indicated in FIGS. 2-8 is used in illustration but the method for manufacturing is not limited to this. For instance, it is possible to form the recess section 108 after forming the second insulating film 113. Furthermore, it is also possible to form the second insulating film 113 and the gate insulating film 111 after forming the source electrode 109 and the drain electrode 110.

Moreover, while above-mentioned method for manufacturing MOSFET 100 has been dealt with citing an example wherein formation of SiO$_2$ film using PCVD method is done for the gate insulating film 111, other than the PCVD method, such as APCVD method, ECR sputtering method, etc., can also be used for forming the film. As for the types of gate insulating film 111, insulating films other than SiO$_2$ having high insulation breakdown resisting voltage with low interface state density, such as AlN, Al$_2$O$_3$, Ga$_2$O$_3$, TaO$_x$, or SiON, etc., can also be used.

While by way of an example of the method for manufacturing MOSFET 100, the case of SiN film forming using PCVD method has been described for the second insulating film 113, other than PCVD, film coating methods such as Cat-CVD method, ECR sputtering method, etc., can also be used. As for the types of film, other than SiN, Al$_2$O$_3$, Sc$_2$O$_3$, MgO, etc., that give an effect of decreasing the surface level may be used. Moreover, if Al$_2$O$_3$ is used for the gate insulating film, materials other than Al$_2$O$_3$ is used in the second insulating film 113.

Further, with respect to above-mentioned embodiment, an example of AlGaN/GaN has been described by way of a combination of the drift layer 105 and the electron supply layer 106, while other than this, combination of materials like AlInGaN/GaN, GaN/InGaN, GaN/GaNAs, GaN/GaInNAsP, GaN/GaInNP, GaN/GaNP, AlGaNInNAsP/GaN, or AlGaN/AlInGaN, etc., can also be applied. Moreover, a spacer layer comprising, for instance, AlN can be introduced in between the drift layer 105 and the electron supply layer 106 in order to improve the mobility of the two-dimensional electron gas layer 130.

Moreover, in the above embodiments, while drift layers comprising p-type or undoped GaN-based semiconductor material are respectively formed between the channel layer 104, and the first electron supply layer 106a and the second electron supply layer 106b, the present invention is not limited to them. In other words, even in the absence of the drift layer described in the above embodiments, the present invention can be applied to MOSFETs having the first electron supply layer 106a and the second electron supply layer 106b respectively formed on the channel layers comprising p-type GaN-based semiconductor material. For example, in the MOSFET 100 according to the first embodiment shown in FIG. 1, even in the absence of the left and right drift layers 105a, 105b, the present invention can be applied to a MOSFET wherein the first electron supply layer 106a and the second electron supply layer 106b are respectively formed on the channel layer 104 comprising p-type GaN-based semiconductor material. In other words, in this MOSFET, the left and right drift layers 105a, 105b are the left and right channel layers 104 comprising p-type GaN-based semiconductor material. In the MOSFET, while two-dimensional electron gas layer 130 is formed on the surface of the left and right channels 104a, 104b, two-dimensional electron gas layer is not formed in the area directly under the gate electrode 112 of the channel layer 104 (It is broken off). When voltage greater than or equal to the threshold is applied in the forward direction, a reverse layer 140 is formed in the channel 104 right under the gate electrode 112. The reverse layer 140 coupled with the two-dimensional electron gas layer 130 produces drain current. Thus, the function of a normally-off type field effect transistor can be obtained.

In the above embodiment, the MOSFET that includes the AlN layer 102 formed on the substrate 101 and the buffer layer 103 formed through alternate lamination of GaN layer and AlN layer on the AlN layer 102, has been described but the present invention is not limited to this arrangement. Instead of forming the AlN layer 102 and the buffer layer 103 on the substrate 101, the present invention is applicable to a FET with a buffer layer comprising GaN formed on the substrate 101, or a FET with a buffer layer formed by alternately laminating the GaN layer and the AlN layer on the substrate 101.

According to the present invention, since the carrier traps between the gate and the drain can be reduced, it can advantageously accomplish a GaN-based field effect transistor that receives small influence from the current collapse phenomenon. Moreover, since insulating film (second insulating film) like SiN, etc., having current collapse decreasing effect has band gap less than those of $SiO_2$ or $Al_2O_3$, the resisting voltage will be insufficient when used as the gate oxide film. However, in the present invention, since suitable materials can be used respectively in the insulating film (second insulating film) of the gate/drain surface and the insulating film (first insulating film) that works as the gate oxide film, a disadvantage can be avoided in terms of decreasing the gate breakdown voltage towards carrying out current collapse counter measure.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A GaN-based field effect transistor, comprising:
   a substrate;
   a channel layer comprised of p-type or undoped GaN-based semiconductor material formed on the substrate;
   an electron supplying layer formed on said channel layer and comprised of GaN-based semiconductor material which has a band gap energy greater than that of said channel layer;
   a first insulating film formed on a surface of said channel layer which was exposed after a part of said electron supplying layer was removed;
   a gate electrode formed on said first insulating film;
   a source electrode and a drain electrode formed so that said gate electrode positions in between them; and
   a second insulating film formed on said electron supplying layer, which is a different insulating film from said first insulating film and has an electron collapse decreasing effect,
   wherein a side surface of the second insulating film between the gate electrode and the drain electrode, which has a contact with the first insulating film, is formed in a different plane from a side surface of the electron supplying layer.

2. The GaN-based field effect transistor according to claim 1,
   wherein said electron supplying layer includes a first electron supplying layer and a second electron supplying layer that are separated from each other so that a gate consisted of said channel layer directly underneath said first insulating film, said first insulating film, and said gate electrode positions between the first and second electron supplying layers, and
   a drift layer comprising p-type or undoped GaN-based semiconductor material are formed between said channel layer and said first electron supplying layer, and said channel layer and said second electron supplying layer, respectively.

3. The GaN-based field effect transistor according to claim 2,
   wherein said first insulating film is comprised of material with greater insulation breakdown resisting voltage than that of said second insulating film.

4. The GaN-based field effect transistor according to claim 1,
   wherein said second insulating film is comprised of either SiN, $Al_2O_3$, $Sc_2O_3$, or MgO.

5. The GaN-based field effect transistor according to claim 1,
   wherein said first insulating film is comprised of $SiO_2$ or $Al_2O_3$.

6. The GaN-based field effect transistor according to claim 1,
   wherein end of said gate electrode at drain side is formed to superpose with said first insulating film and said second insulating film.

7. The GaN-based field effect transistor according to claim 1,
   wherein the second insulating film is comprised of a material different from the first insulating film.

* * * * *